US006621726B2

(12) United States Patent
Zhang et al.

(10) Patent No.: US 6,621,726 B2
(45) Date of Patent: Sep. 16, 2003

(54) BIASING TECHNIQUE FOR A HIGH DENSITY SRAM

(75) Inventors: Kevin X. Zhang, Portland, OR (US); Liqiong Wei, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 63 days.

(21) Appl. No.: 09/991,864

(22) Filed: Nov. 13, 2001

(65) Prior Publication Data

US 2003/0090927 A1 May 15, 2003

(51) Int. Cl.[7] ............................................... G11C 11/40
(52) U.S. Cl. ........................................ 365/154; 365/229
(58) Field of Search ................................. 365/154, 155, 365/156, 227, 229

(56) References Cited

U.S. PATENT DOCUMENTS

| 6,222,780 B1 | * | 4/2001 | Takahashi | 365/154 |
| 6,363,005 B1 | * | 3/2002 | Wang et al. | 365/154 |
| 6,442,060 B1 | * | 8/2002 | Leung et al. | 365/154 |

\* cited by examiner

*Primary Examiner*—Tan T. Nguyen
(74) *Attorney, Agent, or Firm*—Blakely, Sokoloff, Taylor & Zafman LLP

(57) ABSTRACT

According to one embodiment, a memory cell is disclosed. The memory cell includes a first PMOS transistor, a first NMOS transistor coupled to the first PMOS transistor, a second PMOS transistor and a second NMOS transistor coupled to the first PMOS transistor. The first and second PMOS transistors receiving a bias control signal.

22 Claims, 4 Drawing Sheets

BIASING TECHNIQUE FOR A HIGH DENSITY SRAM

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

FIELD OF THE INVENTION

The present invention relates to memory devices; more particularly, the present invention relates to static random access memories (SRAMs).

BACKGROUND

Since the dawn of the electronic revolution in the 1970's, continuous technological advances in the computer industry have depended upon the ability to store and retrieve an ever-increasing amount of data quickly and inexpensively. Thus, the development of the semiconductor memory has played a major role in the advancement of the computer industry over the past few decades.

In particular, with the growing demand for large-scale on-chip cache memory for high performance microprocessors, a high-density static random access memories (SRAM) design becomes more significant. Traditionally six transistor (6T) SRAM cells have been implemented for cache memory devices. However, the size of 6T SRAM cells have become undesirable. As a result, four transistor (4T) SRAM cells have become more desirable because of smaller cell areas. Nonetheless, there is a problem with the design of 4T SRAM cells since it is typically difficult to meet read stability requirements.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A biasing technique for static random access memories (SRAMs) implementing four transistor memory cells is described. According to one embodiment, the delivery of a forward bias voltage during a memory cell standby state enables an access and load transistor to maintain a storage value within the memory cell by helping to provide a leakage current from the access and load transistor. Moreover, the delivery of a reverse bias voltage during a memory cell read state enables an access and load transistor to prevent the memory cell from switching its value during the read.

In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
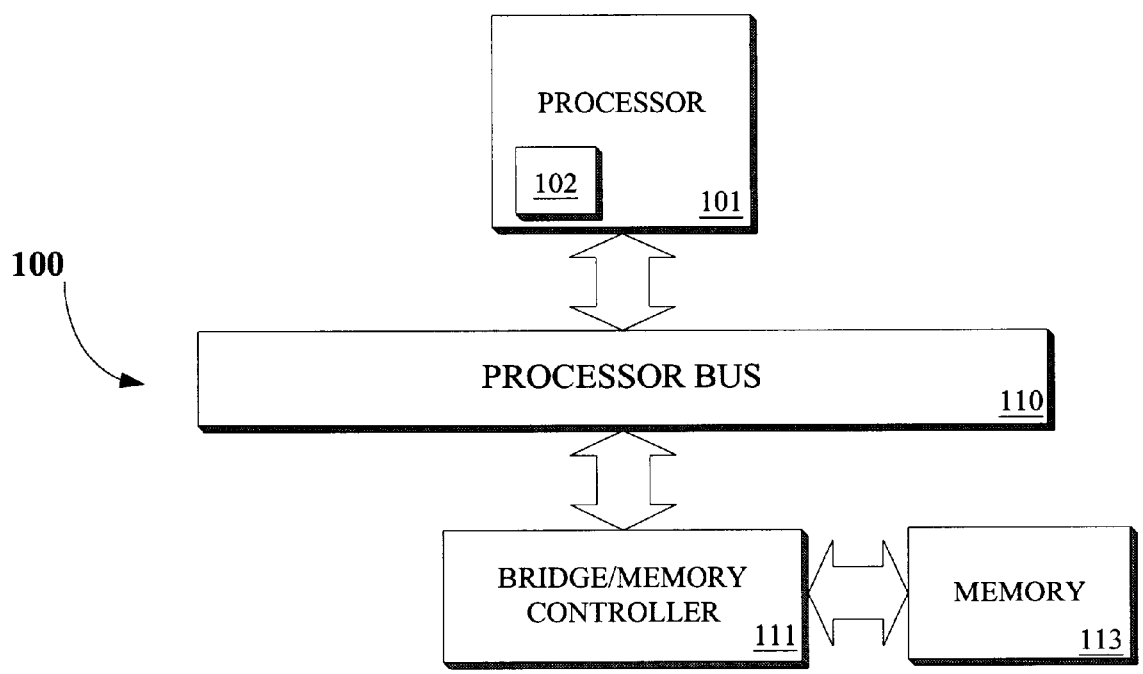
FIG. 1 is a block diagram of one embodiment of a computer system.

FIG. 1 is a block diagram of one embodiment of a computer system 100. Computer 100 includes a processor 101 that processes data signals. Processor 101 may be a complex instruction set computer (CISC) microprocessor, a reduced instruction set computing (RISC) microprocessor, a very long instruction word (VLIW) microprocessor, a processor implementing a combination of instruction sets, or other processor device.

In one embodiment, processor 101 is a processor in the Pentium® family of processors including the Pentium® II family and mobile Pentium® and Pentium® II processors available from Intel Corporation of Santa Clara, Calif. Alternatively, other processors may be used. FIG. 1 shows an example of a computer system 100 employing a single processor computer. However, one of ordinary skill in the art will appreciate that computer system 100 may be implemented using having multiple processors.

Processor 101 is coupled to a processor bus 110. Processor bus 110 transmits data signals between processor 101 and other components in computer system 100. Computer system 100 also includes a memory 113. In one embodiment, memory 113 is a dynamic random access memory (DRAM) device. However, in other embodiments, memory 113 may be a static random access memory (SRAM) device, or other memory device.

Memory 113 may store instructions and code represented by data signals that may be executed by processor 101. According to one embodiment, a cache memory 102 resides within processor 101 and stores data signals that are also stored in memory 113. Cache 102 speeds up memory accesses by processor 101 by taking advantage of its locality of access.

In another embodiment, cache 102 resides external to processor 101. Computer system 100 further comprises a bridge memory controller 111 coupled to processor bus 110 and memory 113. Bridge/memory controller 111 directs data signals between processor 101, memory 113, and other components in computer system 100 and bridges the data signals between processor bus 110 and memory 113.

Figure 2:
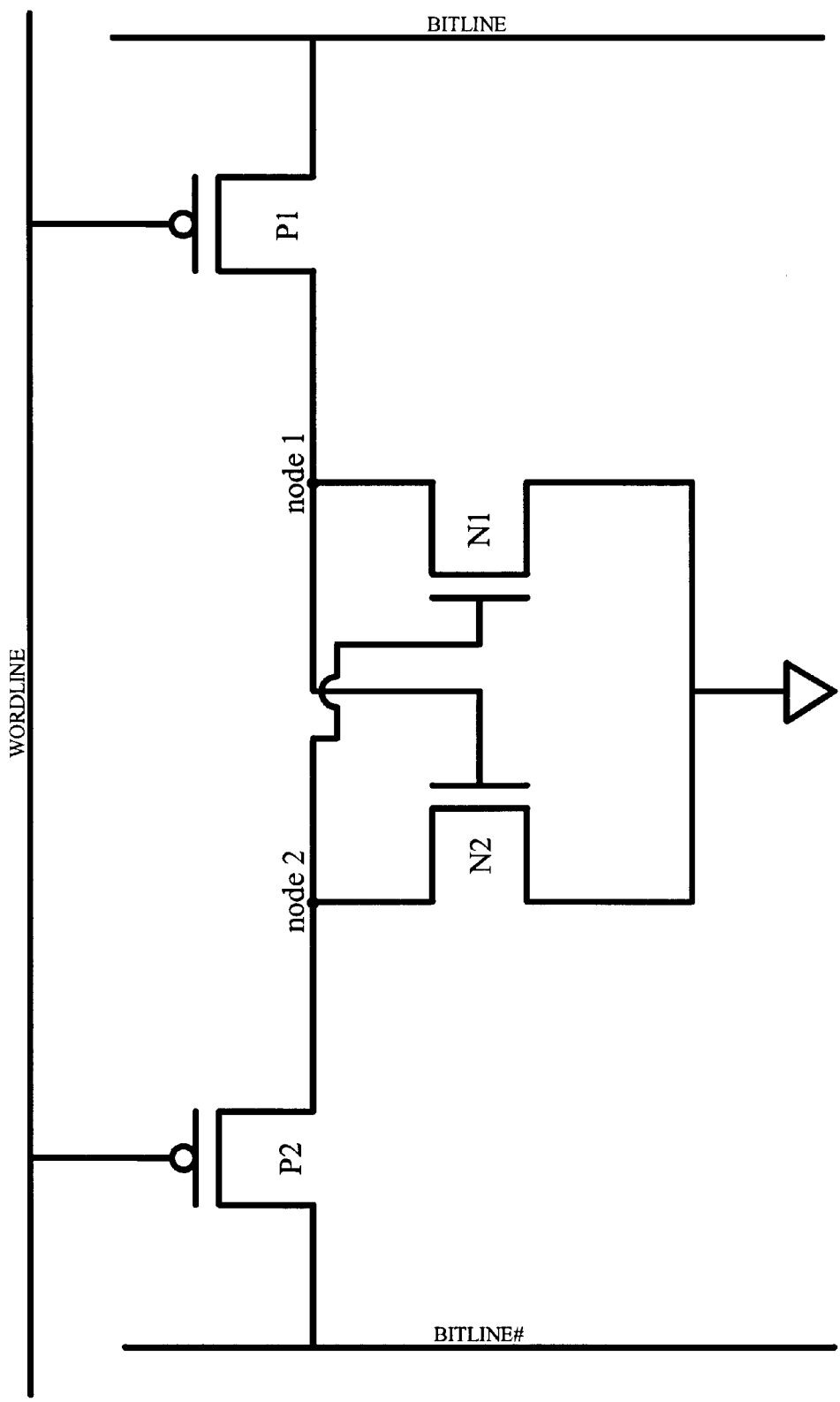
FIG. 2 illustrates an exemplary four-transistor memory.

Typically, six transistor (6T) SRAM cells have been implemented for cache memory devices. However, the size of 6T SRAM cells have become undesirable. As a result, four transistor (4T) SRAM cells have become more desirable because of smaller cell areas. FIG. 2 illustrates an exemplary memory cell. The memory cell includes two PMOS transistors (P1 and P2) and two NMOS transistors (N1 and N2). In addition, the memory cell includes storage node 1 and storage node 2.

The memory cell typically operates in three modes, STANDBY, READ AND WRITE. While in the STANDBY mode, substantial off-state leakage currents are provided from the PMOS transistors to the respective NMOS transistors in order to maintain data storage at storage node 1 and storage node 2. Thus, the PMOS transistors are designed to be strong enough to provide the necessary leakage current.

However, if the PMOS transistors are too strong, the current flowing through transistor P1 or transistor P2 during the READ mode can pull nodes 1 and 2 up, thus flipping the memory cell. Consequently, the loss of the memory state occurs. In order to prevent such an occurrence, transistor N1 typically has to be as least 1.5 times stronger than transistor P1 to ensure cell stability while in the READ mode. However, the increased size of transistor N1 results in a larger area for the memory cell.

Figure 3:
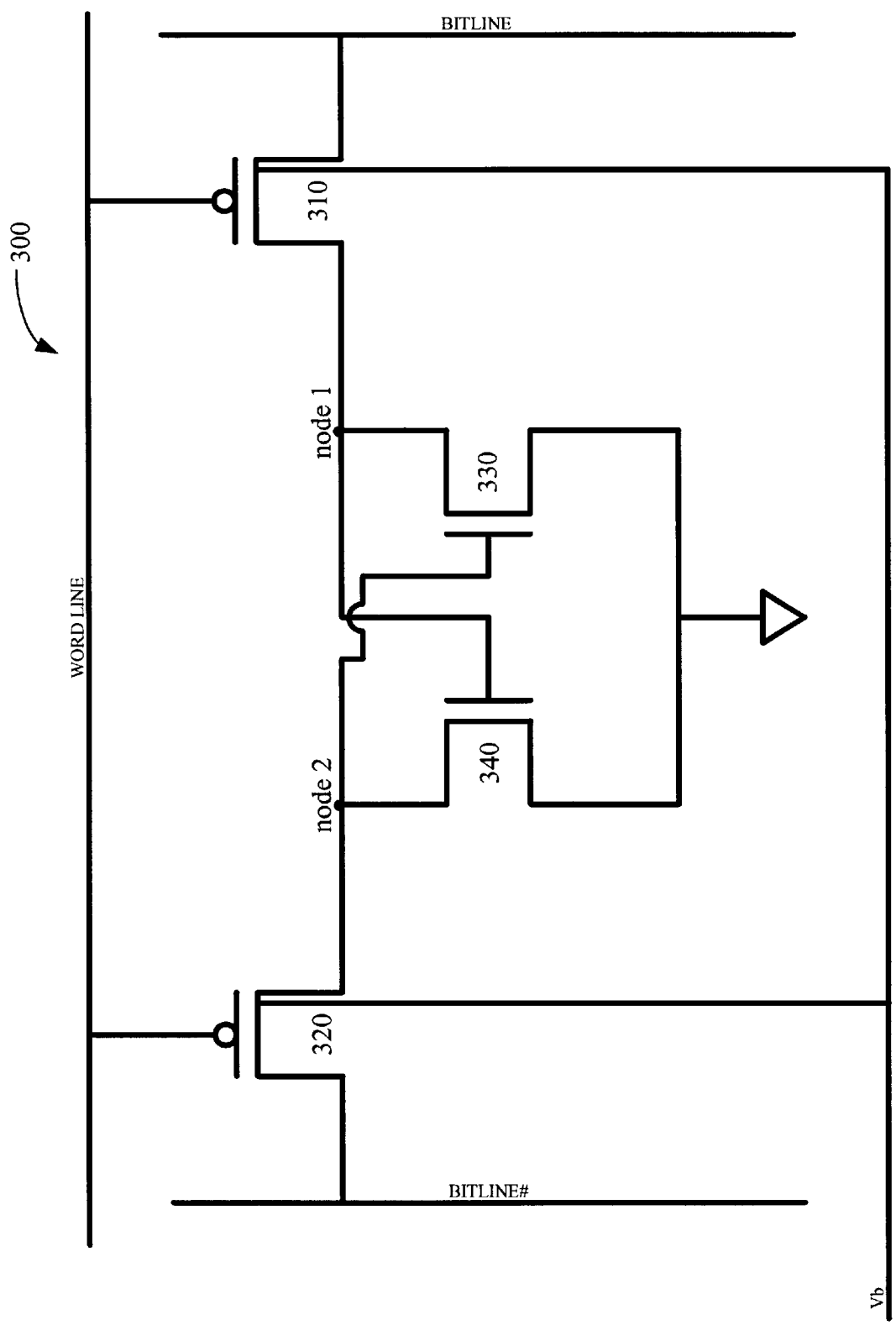
FIG. 3 illustrates one embodiment of a four transistor memory cell with forward bias.

FIG. 3 illustrates one embodiment of a memory cell 300. Memory cell 300 includes PMOS transistors 310 and 320, and NMOS transistors 330 and 340. Transistors 310 and 320 serve as access and load transistors. The gate of transistor 310 is coupled to WORDLINE. WORDLINE is used to activate a row of cells 300 within a SRAM device (e.g., cache 102).

The source of transistor 310 is coupled to one of two bit lines (BITLINE), while the drain is coupled to the drain of transistor 330 at storage node 1. The BITLINE is used to activate a column of cells within the SRAM device. The gate of transistor 320 is also coupled to WORDLINE. The source of transistor 320 is coupled to the other bit line (BITLINE#), and the drain is coupled to the drain of transistor 340 at storage node 2.

Transistors 330 and 340 serve as the body of the SRAM device. The gate of transistor 330 is coupled to the drain of transistor 320 at storage node 2. As described above, the drain of transistor 330 is coupled to storage node 1, and the source is coupled to ground. The gate of transistor 340 is coupled to the drain of transistor 310 at storage node 1. Also, the drain of transistor 340 is coupled to node 2, and the source is coupled to ground.

According to one embodiment, transistors 310 and 320 include a body bias (Vb) that is received from a body control signal. In one embodiment, the body control signal is received from processor 101. However, in other embodiments, the body control signal may be received from memory controller 111. In a further embodiment, transistors 310 and 320 receive a forward body bias during the STANDBY mode and a reverse body bias during the READ mode, as described in further detail below.

While operating in the STANDBY mode, both bit lines and WORDLINE are at a high logic level (e.g., logic 1). Assuming that storage node 1 starts at a high logic level (e.g., logic 0) and storage node 2 starts at a low logic level, node 1 is driven to a low logic level and node 2 is driven high. As a result, a data value is being stored at node 2. The off-state leakage current from transistor 320 helps maintain a logic high value at storage node 2. During the STANDBY mode, the body control signal is received at transistors 310 and 320 as a forward bias.

Forward bias is a voltage supplied to transistors 310 and 320 that is less than Vcc. The forward bias lowers the threshold voltage of transistor 310 and transistor 320, and increases the off state current of transistor 310 and 320. Thus, additional leakage current from transistor 320 can compensate for the current loss at storage node 2 in order to maintain the logic high state.

While operating in the READ mode, both bit lines are at a high logic level, while WORDLINE is at a low logic level. Assuming that storage node 1 starts at a low logic level and storage node 2 starts at a high logic level, storage node 1 is driven high and storage node 2 is driven low. Consequently, current will flow through transistor 310 from BITLINE to storage node 1. As described above, the body control signal is received at transistors 310 and 320 as a reverse bias during the READ mode.

Reverse bias is a voltage supplied to transistors 310 and 320 that is greater than Vcc. The reverse bias makes transistors 310 and 320 increases the threshold voltage of transistor 310 and the ratio of the drive current of NMOS over PMOS transistors increases. As a result, storage node 1 is prevented from being pulled up during the read by current from transistor 310, causing the memory cell to flip. Thus, the read stability of memory cell 300 is improved.

Figure 4:
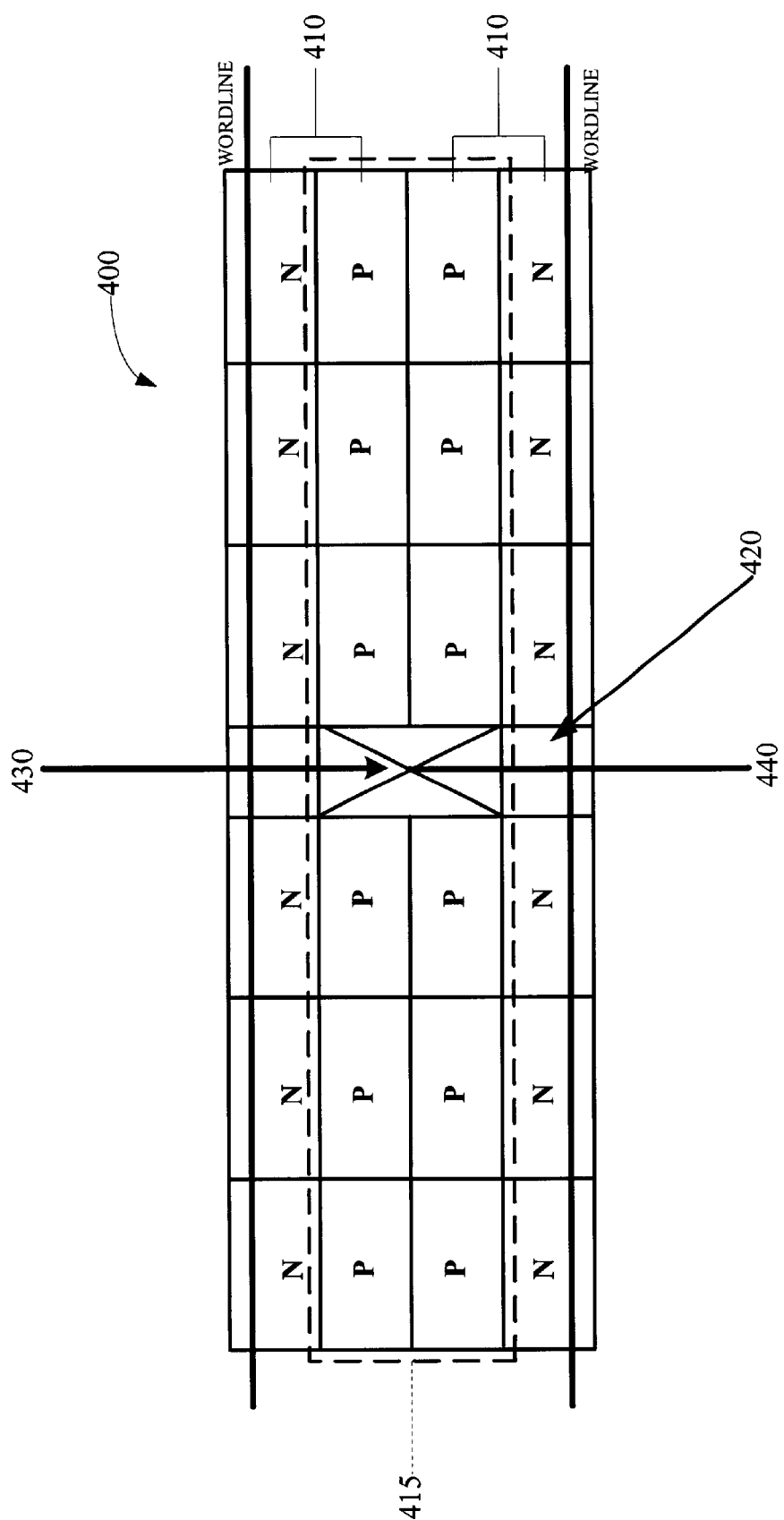
FIG. 4 illustrates one embodiment of a memory device.

FIG. 4 illustrates one embodiment of a memory 400. According to one embodiment, memory 400 is implemented as cache 102. However, memory 400 may be implemented as any type of SRAM device used in computer system 100. Memory 400 includes memory cells 410, N-well 415, gap cell 420, N-well contact 430 and a control signal 440.

Memory cells 410 include a PMOS component (e.g., transistors 310 and 320) and a NMOS component (e.g., transistors 330 and 340). N-well 415 includes the network of p-channel transistors formed within. Thus, all PMOS components in each memory cell 410 of memory 400 share N-well 415. Gap cell 420 in memory 400 that is used for wordline strapping.

N-well contact 430 is located within gap cell 420. A control signal 440 is coupled to contact 430 in gap 420. Control signal 440 is a body control signal that is delivered to contact 430. Thus, each PMOS component within memory 400 receives body control 440. As described above, control signal 440 delivers bias voltages to the PMOS component of memory cells 410. By routing control signal 440 from N-well contact 430, the area impact from transistors 330 and 340 is minimized.

The delivery of bias signals to 4T memory cells, enable smaller transistors to be implemented within the cells. As a result, the 4T memory cells are operable with an even smaller area, resulting in smaller SRAMs.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as the invention.

Thus, a biasing technique for SRAMs implementing four transistor memory cells has been described.

What is claimed is:

1. A memory cell comprising:

a first PMOS transistor;

a first NMOS transistor coupled to the first PMOS transistor;

a first storage node coupled between the first PMOS transistor and the first NMOS transistor;

a second PMOS transistor;

a second NMOS transistor coupled to the second PMOS transistor; and a second storage node coupled between the second PMOS transistor and the second NMOS transistor;

the first and second PMOS transistors receiving a bias control signal to deliver a forward bias voltage to the fir and second PMOS transistors whenever the memory cell is operating in a standby mode.

2. The memory cell of claim 1 wherein the forward bias voltage enables the first storage node to maintain a storage value by providing an off-state leakage current from the first PMOS transistor.

3. The memory cell of claim 1 wherein the bias control signal delivers a reverse bias voltage to the first and second PMOS transistors whenever the memory cell is operating in a ad mode.

4. The memory cell of claim 3 wherein the reverse bias voltage prevents the memory cell from switching its value during the read mode.

5. A memory device comprising:
an N-well;
a plurality of memory cells, each memory cell including:
  a P-channel component; and
  a N-channel component, the P-channel component being formed within the N-well;
a gap cell formed within the N-well; and
a contact within the gap cell that provides a bias control signal to each of the P-channel components within a memory cell.

6. The memory device of claim 5 wherein the P-channel component of each memory cell comprises:
a first PMOS transistor; and
a second PMOS transistor, the first and second PMOS transistors receiving a bias control signal.

7. The memory device of claim 6 wherein the N-channel component of each memory cell comprises:
a first NMOS transistor coupled to the first PMOS transistor; and
a second NMOS transistor coupled to the second PMOS transistor.

8. The memory device of claim 6 further comprising:
a first storage node coupled between the first PMOS transistor and the first NMOS transistor; and
a second storage node coupled between the second PMOS transistor and the second NMOS transistor.

9. The memory device of claim 8 wherein the bias control signal delivers a forward bias voltage to the first and second PMOS transistors whenever the memory cell is operating in a standby mode.

10. The memory device of claim 9 wherein the forward bias voltage enables the first storage node to maintain a storage value by providing an off-state leakage current from the first PMOS transistor.

11. The memory device of claim 8 wherein the bias control signal delivers a reverse bias voltage to the first and second PMOS transistors whenever the memory cell is operating in a read mode.

12. The memory device of claim 11 wherein the reverse bias voltage prevents the memory cell from switching its value during the read mode.

13. A computer system comprising:
a microprocessor; and
a cache memory device, the cache memory device including:
  a plurality of memory cells, each memory cell including a P-channel component and a N-channel component, the P-channel component formed within the N-well;
  a gap cell formed within the N-well; and
  a contact within the gap cell that provides a bias control signal to each of the P-channel components within a memory cell.

14. The computer system of claim 13 wherein the P-channel component of each memory cell comprises:
a first PMOS transistor; and
a second PMOS transistor, the first and second PMOS transistors receiving a bias control signal.

15. The computer system of claim 14 wherein the N-channel component of each memory cell comprises:
a first NMOS transistor coupled to the first PMOS transistor; and
a second NMOS transistor coupled to the second PMOS transistor.

16. The computer system of claim 15 further comprising:
a first storage node coupled between the first PMOS transistor and the first NMOS transistor; and
a second storage node coupled between the second PMOS transistor and the second NMOS transistor.

17. The computer system of claim 16 wherein the bias control signal delivers a forward bias voltage to the first and second PMOS transistors whenever the memory cell is operating in a standby mode.

18. The computer system of claim 17 wherein the forward bias voltage enables the first storage node to maintain a storage value by providing an off-state leakage current from the first PMOS transistor.

19. The computer system of claim 16 wherein the bias control signal delivers a reverse bias voltage to the first and second PMOS transistors whenever the memory cell is operating in a read mode.

20. The computer system of claim 19 wherein the reverse bias voltage prevents the memory cell from switching its value during the read mode.

21. The computer system of claim 13 wherein the cache memory device is coupled to the microprocessor.

22. The computer system of claim 13 wherein the cache memory device is included within the microprocessor.

* * * * *